United States Patent [19]

Shinkawa et al.

[11] 4,187,476
[45] Feb. 5, 1980

[54] SHF BAND OSCILLATOR CIRCUIT USING FET

[75] Inventors: Keiro Shinkawa; Hiroji Shoyama; Chuichi Sodeyama, all of Yokohama, Japan

[73] Assignee: Hitachi, Ltd., Japan

[21] Appl. No.: 873,526

[22] Filed: Jan. 30, 1978

[30] Foreign Application Priority Data

Jan. 31, 1977 [JP] Japan .................................. 52-8650
Jan. 31, 1977 [JP] Japan .................................. 52-8651
Feb. 14, 1977 [JP] Japan .................................. 52-14232
Feb. 14, 1977 [JP] Japan .................................. 52-14233

[51] Int. Cl.$^2$ .......................... H03B 5/04; H03B 5/18
[52] U.S. Cl. ................................. 331/117 D; 331/99; 331/176
[58] Field of Search ................. 331/117 D, 176, 96, 331/99, 107 SL

[56] References Cited

U.S. PATENT DOCUMENTS

| 2,823,312 | 2/1958 | Keonjian | 331/176 |
| 3,199,050 | 8/1965 | Schleenbecker | 331/176 |
| 3,246,258 | 4/1966 | Boreen | 331/176 |
| 3,721,918 | 3/1973 | Rosen et al. | 330/56 |

OTHER PUBLICATIONS

IEEE Trans on Microwave Theory and Tech. vol. MTT-23, No. 8, Aug. 1975, pp. 661-667, Maeda et al.

Primary Examiner—Siegfried H. Grimm
Attorney, Agent, or Firm—Craig and Antonelli

[57] ABSTRACT

An SHF band oscillation circuit using a field effect transistor (FET) having a feedback path between gate and drain or source and a resonator connected to the gate. Impedances connected to the respective terminals of the FET comprise microstrip lines. A gate bias circuit includes a temperature-sensitive semiconductor device so that a gate bias is changed with the change in ambient temperature. In this manner, the change of oscillation frequency which would otherwise occur by the change of the ambient temperature is compensated. The resonator connected to the gate comprises a dielectric resonator to further stabilize the oscillation frequency.

5 Claims, 16 Drawing Figures

SHF BAND OSCILLATOR CIRCUIT USING FET

LIST OF PRIOR ART REFERENCES (37 CFR 1.56(a))

The following reference is cited to show the state of the art:

The article "Design and Performance of X-band Oscillators with GaAs Schottky-Gate Field-Effect Transistors" by M. Maeda et al published in IEEE Transactions on Microwave Theory and Techniques, Vol. MTT-23, No. 8, August 1975, pages 661–667.

BACKGROUND OF THE INVENTION

The present invention relates to an oscillation circuit using a field effect transistor (FET), and more particularly to an oscillation circuit suited for use in a local oscillation circuit of an SHF band receiver.

A circuit as shown in FIG. 1 has been used as a prior art oscillation circuit including an FET in a distributed constant circuit using microstrip lines. In FIG. 1, numeral 1 denotes an FET having a shape suited for use in a microstrip circuit, 2 denotes a gate terminal, 5 denotes a source terminal and 7 denotes a drain terminal. The gate terminal 2 has a length which is approximately equal to a quarter (¼) wavelength of a desired oscillation frequency, and it is connected to a resonator 3 which comprises an open-ended microstrip line. A bias voltage is applied to the gate terminal 2 through a choke coil 4 from a biasing circuit (not shown). The source terminal 5 is connected to a microstrip line 6 having its terminal end connected to ground and acting as a feedback circuit. The terminal end of the line 6 is connected to a conductor on the backside of a substrate constituting a microstrip at an end thereof or grounded by being connected to a conductive case, as is usually done in the microstrip circuit, but in the illustrated drawing it is designated by a grounding symbol used in a conventional circuit diagram. Throughout the drawings of the present invention, the grounding portions are similarly designated. The drain terminal 7 is connected to a microstrip line 8 which conducts an oscillation output signal. The output microstrip line 8 is split at the intermediate point thereof and the respective halves are interconnected by a capacitor 10 to isolate itself from the succeeding stage D.C.-wise. A bias voltage is applied to the drain terminal 7 through a choke coil 9 from a biasing circuit (not shown).

In the circuit thus constructed, feedback is applied from the drain to the gate by the feedback circuit 6 connected to the source terminal 5 so that the circuit oscillates at a resonance frequency of the resonator 3 connected to the gate terminal 2. In the oscillation circuit, a negative bias voltage is normally applied to the gate terminal 2.

In such an oscillation circuit, the FET 1 may be connected in a grounded drain configuration as shown in FIG. 2. In the case of the grounded drain configuration, no external feedback path is necessary because the amount of feedback between the gate and the source within the FET is large. Accordingly, as shown in FIG. 2, the drain terminal 7 may be grounded and an output line 11 may be connected to the source terminal 5. The capacitor 10 is inserted at the intermediate point of the output line 11 to block D.C. In this circuit, negative voltages are required for the bias voltage applied to the gate terminal through the choke coil 4 and the bias voltage applied to the source terminal 5 through a choke coil 12.

In the oscillation circuits shown in FIGS. 1 and 2, an oscillation condition is met by a relation between impedances of the FET 1 and the resonator 3 viewed from the gate terminal 2. As is well known, an impedance of an open-ended line changes with a relation between a length of the line and a wavelength and with a frequency. Further, there exist many frequencies, not one, which cause the same impedance to appear. As a result, if the impedance of the FET changes by the change of ambient temperature, the oscillation frequency changes greatly or jumps to an undesirable frequency.

SUMMARY OF THE INVENTION

It is an object of the present invention to provide an FET oscillation circuit the oscillation frequency of which is stable against the change of ambient temperature and does not jump to an undesired frequency and which is suited for use in a local oscillation circuit of a receiver for receiving a television signal transmitted in an SHF band.

In order to attain the above object, according to the present invention, a gate bias of an FET having its gate connected to a resonator is controlled by a voltage divider circuit including a temperature-sensitive semiconductor device to change the gate bias in accordance with the change of ambient temperature. In this manner, the change of the impedance of the FET due to the change of ambient temperature is compensated by changing the gate bias to change the drain current for attaining the stabilization of the oscillation frequency. In order to further stabilize the oscillation output, the resistor is connected in parallel with the resonator connected to the gate so that an impedance connected to the gate is essentially determined by that resistor at a frequency distant from the resonance frequency of the resonator. Furthermore, the resonator connected to the gate is constituted by a dielectric resonator to attain a more stable oscillation circuit.

DESCRIPTION OF THE PREFERRED EMBODIMENTS

Figure 1:
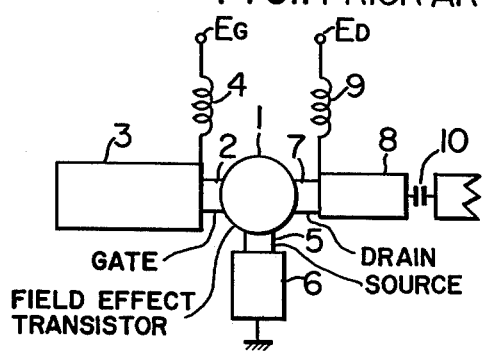
FIG. 1 shows a circuit diagram including microstrip patterns illustrating one example of a prior art oscillation circuit using a microstrip circuit.
Figure 3:
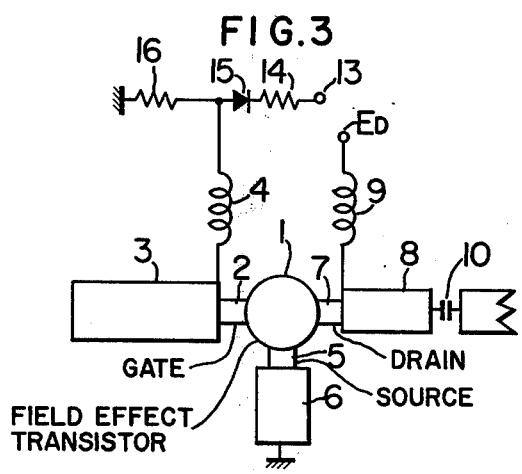
FIG. 3 shows a circuit diagram illustrating one embodiment of the present invention.

FIG. 3 shows one embodiment of the present invention. As in the circuit shown in FIG. 1, the resonator 3 is connected to the gate terminal of the FET 1, the feedback line 6 is connected to the source terminal 5, and the output line 8 is connected to the drain terminal 7. The gate biasing circuit comprises a series connected of a resistor 14, a varistor 15 as a temperature-sensitive semiconductor device and a resistor 16, connected between a terminal 13 to which a biasing supply voltage is applied and ground, and a choke coil 4 connected between the junction of the varistor 15 and the resistor 16 and the gate terminal 2. A gate voltage $V_G$ applied to the gate terminal 2 is given by the following formula;

$$V_G = \frac{(-V + V_B)R_2}{R_1 + R_2} \quad (1)$$

where $R_1$ and $R_2$ are resistances of the resistors 14 and 16, respectively, $-V$ is a voltage applied at the terminal 13 and $V_B$ is a voltage drop across the varistor 15.

When the voltage across the varistor 15 changes by $\Delta V_B$ as ambient temperature changes, the resulting gate voltage $V_G'$ is expressed by;

$$V_G' = \frac{(-V + V_B + \Delta V_B)R_2}{R_1 + R_2} = \frac{(-V + V_B)R_2}{R_1 + R_2} + \frac{\Delta V_B R_2}{R_1 + R_2} \quad (2)$$

Namely, the gate voltage changes by $(\Delta V_B R_2)/(R_1+R_2)$ when the voltage across the varistor changes by $\Delta V_B$. Since the voltage across the varistor usually changes with the change of ambient temperature at the rate of $-3$ mV/°C., the gate voltage will show the change of $(-3R_2/R_1+R_2)$ mV/°C.

The change of the oscillation frequency to the change of the gate voltage was proved to be $-50$ MHz/V by an experiment at 10 GHz band. In such an oscillation circuit, therefore, by the action of the varistor 15 for the change of the ambient temperature, the change of the oscillation frequency to the change of the ambient temperature is given by a product of 50 (MHz/v) and $(-3R_2)/(R_1+R_2) \times 10^{-3}$ (V/°C.), that is, $(0.15 R_2)/(R_1+R_2)$ (MHz/°C.).

Figure 2:
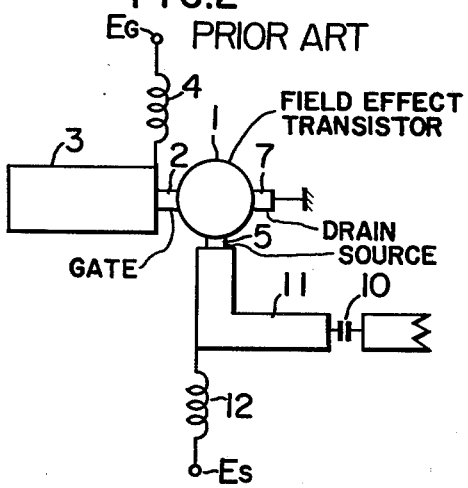
FIG. 2 shows a similar circuit to that of FIG. 1, in which an FET is connected in a grounded drain configuration.
Figure 4:
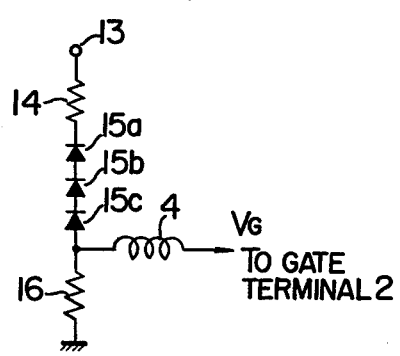
FIG. 4 shows a circuit diagram illustrating an example of a biasing circuit which serves to increase the change of bias voltage due to the temperature change.

On the other hand, the change of the oscillation frequency by the change of the impedance of the FET due to the change of the ambient temperature was proved to be $-0.5$ MHz/°C. by an experiment for a similar circuit. Accordingly, if the circuit is designed such that the change of the oscillation frequency due to the change of the bias voltage to the change of the ambient temperature is equal to $+0.5$ MHz/°C., the oscillation frequency will not change in spite of the change of the ambient temperature. In order to obtain greater change of the gate voltage to the change of the ambient temperature, a plurality of varistors may be connected in series as shown in FIG. 4. When n varistors are used, the change of the gate voltage to the change of the ambient temperature is multiplied by the factor of n. Accordingly, in the oscillation circuit described above in which the oscillation frequency changes at the rate of 0.5 MHz/°C., if the constants of $R_1$, $R_2$ and n are chosen to satisfy the formula $0.15 \, R_2/(R_1+R_2) \cdot n = 0.5$, the change of the oscillation frequency by the change of the ambient temperature can be eliminated. This compensation by the bias circuit may be equally applied to an oscillation circuit as shown in FIG. 2 using a grounded drain configuration.

Figure 5:
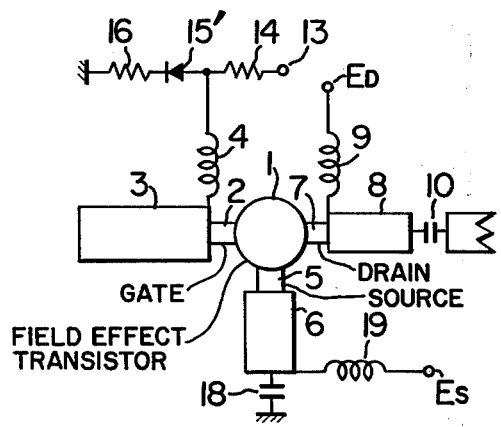
FIGS. 5 and 6 show examples of an oscillation circuit in which a positive bias voltage is applied to a source of the FET.

FIG. 5 shows an oscillation circuit in which a terminal end of the line 6 acting as a feedback impedance connected to the source terminal 5 is not directly grounded but grounded through a capacitor 18, and a positive bias voltage is applied to the source through a choke coil 19. In this arrangement, a positive bias voltage relative to ground may be applied to the gate so that the voltage supplies required are all of a positive voltage type. In the embodiment described above, the oscillation frequency which tends to decrease as the ambient temperature rises is compensated by lowering the gate bias to raise the oscillation frequency. In the present embodiment, too, the circuit is designed such that the gate bias is lowered as the ambient temperature rises. To this end, as shown in FIG. 5, a varistor 15' is inserted between the junction of the choke coil 4 and ground, as is opposite to the case of FIGS. 3 and 4. The gate voltage $V_G'$ is given by the following formula:

$$\begin{aligned} V_G' &= \frac{(V - V_B - \Delta V_B)R_2}{R_1 + R_2} + V_B + \Delta V_B \\ &= \frac{(V - V_B)R_2}{R_1 + R_2} + V_B - \frac{\Delta V_B R_2}{R_1 + R_2} + \Delta V_B \\ &= \{\frac{(V - V_B)R_2}{R_1 + R_2} + V_B\} + \frac{\Delta V_B R_1}{R_1 + R_2} \end{aligned} \quad (3)$$

where V is a voltage applied to the terminal 13, $R_1$ and $R_2$ are resistances of the resistors 14 and 16, respectively, and $\Delta V_B$ is the change of the voltage across the varistor due to the change of the ambient temperature.

Accordingly, the gate voltage changes by $\Delta V_B R_1/(R_1+R_2)$ by the change of $\Delta V_B$, and hence the change of the oscillation frequency by the change of the ambient temperature can be compensated as in the previous embodiment. In order to attain a greater change of the bias voltage, it is apparent that the number of the varistors 15' may be increased as in the previous embodiment.

Figure 6:
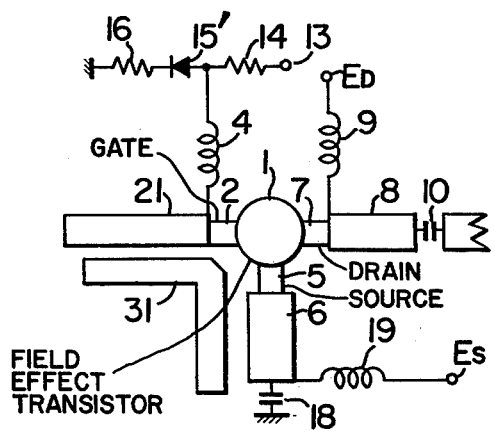

FIG. 6 shows an oscillation circuit similar to that shown in FIG. 5, in which a line 21 is connected to the gate terminal 2 in place of the resonator 3 and a resonator 31 is arranged closely to the line 21. The resonator 31 has a total length equal to one half a wavelength of a desired oscillation frequency with one half the total length, that is, a one-quarter wavelength portion being arranged in parallel with the line 21 and another one-quarter wavelength portion constituting an open-ended resonator. The compensation for the change of the oscillation frequency due to the change of the ambient temperature in accordance with the present invention can be applied regardless of the configuration of the resonator connected to the gate.

Figure 7:
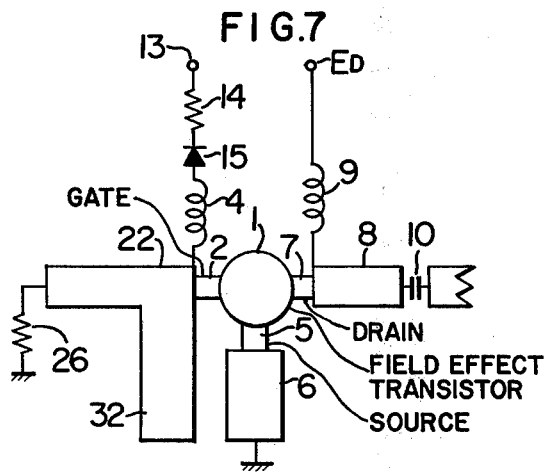
FIG. 7 shows a circuit diagram which attains a stable oscillation and in which a portion of a bias circuit is constituted by the same resistor.
Figure 8:
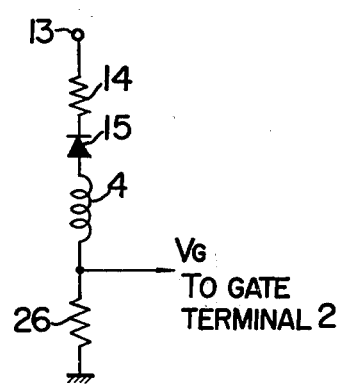
FIG. 8 shows the bias circuit shown in FIG. 7.
Figure 9:
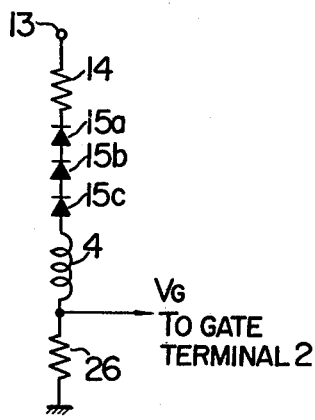
FIG. 9 shows a similar bias circuit to that shown in FIG. 8, in which the temperature dependency of the bias circuit is large.

FIG. 7 shows a further embodiment of the present invention. In the present embodiment, a resonator 32 which is similar to the resonator 3 shown in FIG. 3 is connected to the gate terminal 2 and a line 22 is connected in parallel therewith, which line 22 is terminated with a resistor 26. The bias circuit for applying the gate voltage has been slightly modified from that of FIG. 3. Namely, a series connection of the resistor 14, the varistor 15 and the choke coil 4 is connected between the power supply terminal 13 for the bias voltage and the gate terminal 2. The remaining portions are constructed in the same manner as the circuit of FIG. 3. The gate bias circuit of the present circuit can be represented as shown in FIG. 8 because the line 22 may be neglected for D.C. The position of the connection of the choke coil 4 in this circuit is different from that in FIG. 3 but the bias circuit of FIG. 8 functions in quite the same manner as the bias circuit of FIG. 3 because the voltage applied to the gate is the same regardless of the position of insertion of the choke coil since the bias voltage is a D.C. voltage. Accordingly, the formulas (1) and (2) described above are equally applied, where $R_2$ represents the resistance of the resistor 26, and the change of the oscillation frequency to the change of the ambient temperature can be compensated in the same manner as in the previous embodiments. Furthermore, as in the previous embodiments, varistors 15a, 15b and 15c may be added, as required, as shown in FIG. 9.

The resistor 26 constituting the bias circuit not only determines the bias voltage but also it has a useful function as described below. Since the resonator 32 is open-ended and has a length approximately equal to a quarter of the wavelength of the oscillation frequency, an impedance thereof viewed from the gate is very small near the oscillation frequency and it satisfies the oscillation condition of the FET 1. Furthermore, if a characteristic impedance of the line 22 is chosen close to the resistance of the resistor 26, the same effect as if the resistor 26 were directly connected to the gate terminal 2 is obtained, and it can be regarded as if only the resistor 26 were connected to the gate terminal 2 at the frequencies other than the resonance frequency of the resonator 32 or the oscillation frequency. Accordingly, a parasitic impedance which satisfies the oscillation condition at undesired frequencies is unlikely to be formed, and a problem of jumping of the oscillation frequency to an undesired frequency is avoided.

Figure 10:
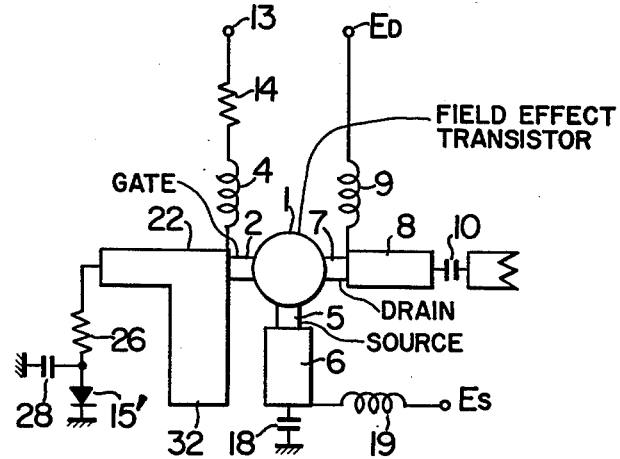
FIG. 10 shows an oscillation circuit similar to that of FIG. 7, which has been modified such that a positive bias voltage is applied to the source.
Figure 11:
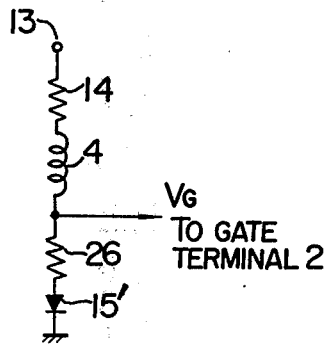
FIG. 11 shows an equivalent circuit of the gate bias circuit shown in FIG. 10.

FIG. 10 shows an embodiment in which the source terminal 5 of the FET 1 is floated D.C.-wise by a capacitor 18 and a positive bias voltage is applied to the source terminal 5 through a choke coil 19. In this embodiment, as in the embodiment shown in FIG. 5, since the gate bias is driven by a positive voltage, the varistor 15' for changing the gate bias for the change of the ambient temperature is connected between the gate terminal 2 and ground. A capacitor 28 serves as a bypassing capacitor which appears as if the line 22 were terminated only by the resistor 26 for a high frequency signal. Again, in the present embodiment, the resistor 26 has the dual function of preventing the oscillation at undesired frequencies and as a dividing resistor for applying the gate bias. FIG. 11 shows only the gate bias circuit of the oscillation circuit. Since the choke coil 4 may be neglected for D.C., the bias circuit of FIG. 11 is equivalent to the bias circuit shown in FIG. 5 or 6, and the bias voltage given by the formula (3) described above, where $R_2$ represents the resistance of the resistor 26 which is applied to the gate terminal 2. As a result, the change of the oscillation frequency due to the change of the ambient temperature is compensated by the changing bias voltage in the same manner as in the previous embodiments.

Figure 12:
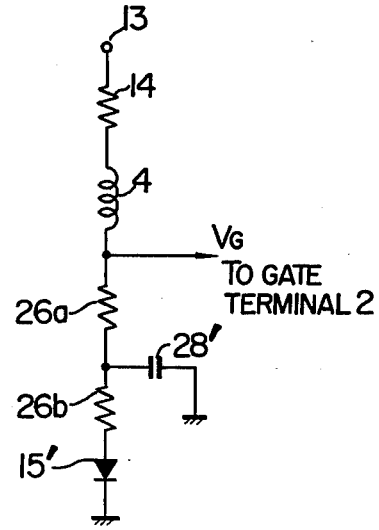
FIG. 12 shows a bias circuit in which a common resistor is used for stabilizing the oscillation and for determining the bias voltage to derive substantially different resistances.

As described above, the resistor 26 has the dual function of preventing the jumping of the oscillation frequency and determining the gate bias. When the same resistance cannot be used for both functions but a smaller resistance is required for preventing the jumping of the oscillation frequency and a larger resistance is required for assuring necessary magnitudes of the bias voltage and the change of the bias voltage due to the temperature change, the resistor inserted between the gate terminal and ground may be split into two serially connected resistors 26a and 26b, as shown in FIG. 12, and the junction thereof may be grounded through the bypassing capacitor 28'. The arrangement is equivalent, for a high frequency signal, to a circuit in which the gate terminal 2 is grounded through the resistor 26a, and the bias voltage is determined by a sum of the resistances of the two resistors 26a and 26b because the bypassing capacitor 28' may be neglected for a D.C. component of the bias voltage.

Figure 13:
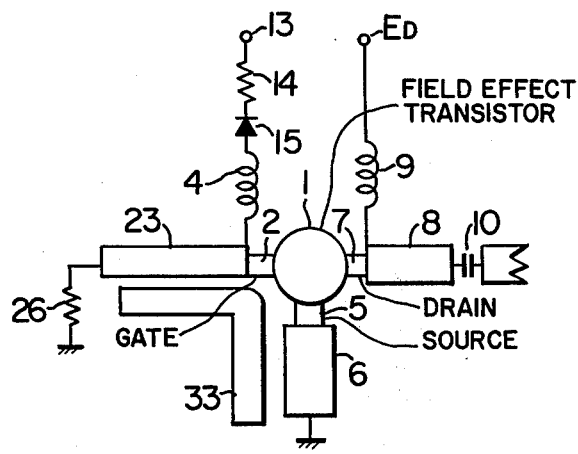
FIG. 13 shows a similar oscillation circuit to that of FIG. 7, in which a different resonator is connected to the gate.

FIG. 13 shows an oscillation circuit having a common resistor for a portion of resistors of the bias circuit for the gate bias and a resistor for stabilizing the oscillation like the circuit of FIG. 7, in which instead of directly connecting the resonator to the gate terminal 2, the resonator 33 is connected to the line 23 which is connected to the gate terminal 2, as in the embodiment of FIG. 6. The present embodiment also attains the similar effect to those attained by the previous embodiments.

Figure 14:
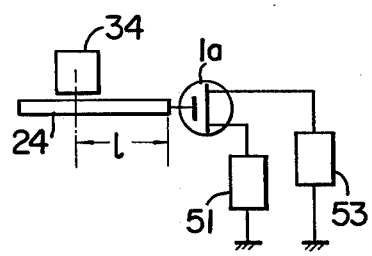
FIG. 14 shows an equivalent circuit of an oscillator circuit in which the resonator connected to the gate comprises a dielectric resonator.

The resonator connected to the gate terminal is not limited to the arrangements described above but other arrangement may be used. For example, in the circuits shown in FIG. 6 or 13 in which the line 21 or 23 is connected to the gate terminal 2, a dielectric resonator constructed three-dimensionally by high dielectric constant material may be used in place of the microstrip resonator 31 or 33. FIG. 14 shows an equivalent circuit of such an oscillation circuit with the biasing circuit being omitted. Numeral 24 denotes a microstrip line connected to the gate of the FET 1a, and a dielectric resonator 34 is arranged at a position displaced from the gate by a distance l. The dielectric resonator 34 comprises a three-dimensional dielectric body such as a parallelpiped, cube or cylinder, and constitutes a resonator similar to a cavity resonator depending on the shape and size of the body. The line 24 to which the resonator 34 is coupled is equivalent to a circuit shorted at the position of the resonator by an L-C series resonance circuit having the resonance frequency of the resonator. The impedance at the resonance frequency viewed from the gate of the FET 1a to the line 24 thus changes with the distance l to the position of the dielectric resonator 34. Numeral 51 denotes a feedback impedance connected to the source of the FET 1a, and numeral 53 denotes a load impedance connected to the drain. By adjusting the feedback impedance 51 such that an input impedance of the FET 1a viewed from the gate exhibits a negative resistance and choosing the distance l to the dielectric resonator 34 such that the impedance of the line 24 viewed from the gate satisfies the following condition, the circuit can be oscillated at the resonance frequency of the dielectric resonator 34. The oscillation condition is given by $R_i \geq R_l$, where the impedance of the FET 1a viewed from the gate is represented by $Z_i = -R_i + jX_i$ and the impedance of the line 24 viewed from the gate is represented by $Z_l = R_l - jX_l$. In order to satisfy the above condition, the distance l from the gate to the resonator 34 may be selected to be approximately equal to $m\lambda/2$, where m is an integer and $\lambda$ is a wavelength at the resonance frequency of the resonator. Since the dielectric resonator has a very high Q of resonance, the stability of the oscillation frequency is further improved by using the dielectric resonator as the resonator connected to the gate.

Figure 15:
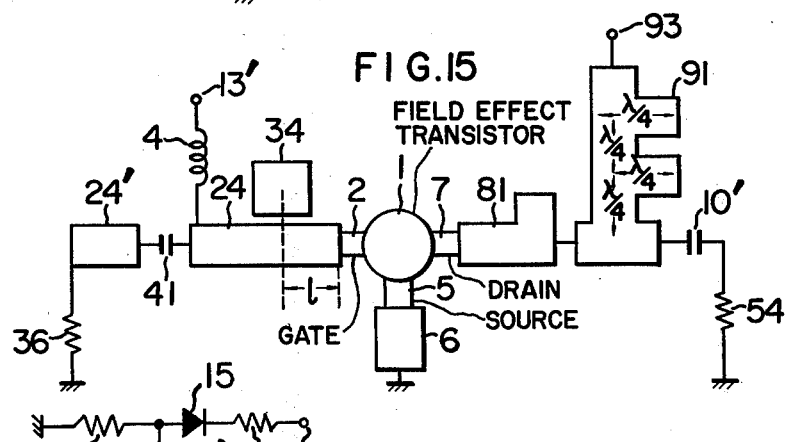
FIGS. 15 and 16 show circuit diagrams illustrating examples of an oscillation circuit using a dielectric resonator for attaining stable oscillation.

FIG. 15 shows an embodiment of an oscillation circuit having the dielectric resonator applied to the gate line. A line 24 to which the dielectric resonator 34 is coupled is connected to the gate terminal 2 of the FET 1 and a line 24' is connected to the end of the line 24 through a D.C. blocking capacitor 41. The line 24' is terminated with a dummy resistor 36. By choosing the resistance of the dummy resistor 36 to be equal to a characteristic impedance of the lines 24 and 24', the impedance viewed from the gate terminal 2 comprises only the dummy resistance at the frequencies other than the resonance frequency of the dielectric resonator 34. If the dummy resistor is not provided, the lines 24 and 24' would constitute several resonance circuits having different resonance frequencies, but when the dummy resistor is provided, a stable oscillation is attained because no parasitic resonance circuit other than the resonance circuit of the dielectric resonator 34 is formed. The resistance value may be on the order of 50–200 Ω. Since there exists no parasitic resonance frequency, the choke coil of the bias circuit may be designed taking into consideration only the resonance frequency of the dielectric resonator, that is, the impedance at the frequencies near the desired oscillation frequency, and hence the design of the circuit is simplified.

An impedance converter connected to the drain terminal 7 may be one which is conventionally used in the strip line technology and it carries out the function of impedance matching for a load 54 when the lines having different characteristic impedances are interconnected. Numeral 91 denotes a stab filter for blocking the resonance frequency signal and a drain bias voltage supplied to a terminal 93 is applied to the drain terminal 7. Numeral 10' denotes a D.C. blocking capacitor for preventing the bias voltage from being applied to the load resistor 54.

A gate bias voltage is applied from a terminal 13' through the choke coil 4 connected to the line 24. When the dielectric resonator 34 is used, a stable frequency oscillation output is obtained because of high Q but the oscillation frequency may change by a temperature characteristic of the dielectric resonator when the ambient temperature changes. By supplying the gate bias voltage to the terminal 13' through the temperature compensation bias circuit described above depending on the temperature characteristic of the oscillation frequency, a more stable oscillation circuit can be provided. In order to change a polarity of change of the bias voltage to the temperature change, the varistors 15a, 15b and 15c in the circuit shown in FIG. 4, for example, may be inserted closer to ground than the junction point of the choke coil 4.

In the circuit shown in FIG. 15, if a dummy resistor 36 is directly connected to the line 24 and the D.C. blocking capacitor 41 and the line 24' are omitted, and a resistor and a varistor are connected to the terminal 13' in the same manner as in FIG. 7, the dummy resistor 36 may be commonly used as a dividing resistor for the bias circuit.

Figure 16:
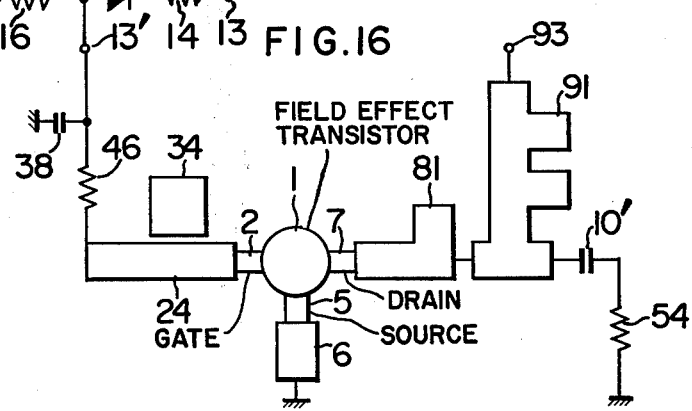

FIG. 16 shows an oscillation circuit in which a dummy resistor also functions as a choke coil, and hence the choke coil is omitted. The present circuit differs from the circuit of FIG. 15 in that a dummy resistor 46 instead of the choke coil 4 is connected to the line 24 which is connected to the gate terminal 2 and the end of the dummy resistor 46 closer to the power supply is grounded through a bypassing capacitor 38. Also the line 24', the D.C. blocking capacitor 41 and the dummy resistor 36 connected between the line 24' and ground are omitted. The remaining portions are exactly the same as FIG. 15. With this arrangement, the oscillation circuit can be constructed without using any coil component.

In the present embodiment, too, by applying the gate bias through a voltage divider circuit comprising a resistor and a temperature sensitive semiconductor device such as a varistor as described in connection with the previous embodiments, the temperature dependency of the oscillation frequency can be reduced to a very small value.

For example, as shown in the figure, when the bias circuit shown in FIG. 3 is intended to be used in the oscillator of FIG. 16, a series circuit consisting of a resistor 14, a varistor 15, and a resistor 16 is connected between a terminal 13 and ground and one end of a resistor 46 is connected with the point 13' between the varistor 15 and the resistor 16 while the other end thereof is connected with the microstrip line 24. Thus, the dummy resistor 46 for the microstrip line is used as a choke coil for the gate bias.

We claim:
1. An oscillation circuit using a field effect transistor which compensates for the change of an oscillation frequency due to a change of ambient temperature, and generates a signal at an SHF band frequency, comprising:
   first means having an input terminal connected to a gate of said field effect transistor and applying feedback between an output terminal and the input terminal of said field effect transistor;
   a microstrip line connected to the gate of said field effect transistor;
   a first resistor having an impedance approximately equal to the characteristic impedance of said microstrip line and connected to a terminal end of said microstrip line;
   second means including said first resistor and a temperature sensitive semiconductor device for applying a bias voltage to said gate wherein said bias voltage changes with the change of the ambient temperature; and
   a resonator arranged adjacent to said microstrip line and having a resonance frequency approximately equal to a desired oscillation frequency.
2. An oscillation circuit according to claim 1 wherein said resonator comprises an open-ended microstrip line which is connected to said microstrip line and has a length approximately equal to a quarter a wavelength at the desired oscillation frequency.
3. An oscillation circuit according to claim 1, wherein one end terminal of said first resistor is connected with the terminal end of said microstrip line while the other end terminal of said first resistor is connected to ground through a capacitor, and said second means includes a voltage divider comprising said temperature sensitive semiconductor device and a second resistor, which voltage divider is connected with said other end terminal of said first resistor.

4. An oscillation circuit according to claim 1, wherein said first resistor is directly connected between the terminal end of said microstrip line and ground, and said second means includes a series circuit of a second resistor and said temperature sensitive semiconductor device connected with said microstrip line through a choke coil.

5. An oscillation circuit according to claim 1, 3, or 4 wherein said resonator is a dielectric resonator.

* * * * *